United States Patent [19]
Oae et al.

[11] Patent Number: 5,420,433
[45] Date of Patent: May 30, 1995

[54] CHARGED PARTICLE BEAM EXPOSURE APPARATUS

[75] Inventors: Yoshihisa Oae; Yasushi Takahashi; Hiroshi Yasuda, all of Kawasaki, Japan

[73] Assignee: Fujitsu Limited, Kawasaki, Japan

[21] Appl. No.: 214,415

[22] Filed: Mar. 18, 1994

[30] Foreign Application Priority Data
Jun. 24, 1993 [JP] Japan .................... 5-153777

[51] Int. Cl.6 .......................... H01J 37/317
[52] U.S. Cl. ................... 250/398; 250/492.2; 250/399
[58] Field of Search ............ 250/398, 492.2, 399

[56] References Cited

U.S. PATENT DOCUMENTS

| | | | |
|---|---|---|---|
| 3,736,422 | 5/1973 | Weber et al. | 250/399 |
| 4,918,358 | 4/1990 | Aihara et al. | 250/492.2 |
| 5,155,368 | 10/1992 | Edwards et al. | 250/398 |

FOREIGN PATENT DOCUMENTS 56-94739  7/1981  Japan ................. 250/492.2

Primary Examiner—Jack I. Berman
Attorney, Agent, or Firm—Armstrong, Westerman, Hattori, McLeland & Naughton

[57] ABSTRACT

A barrier electrode is formed above an article to be exposed so as to be opposite the surface of the article to be exposed. A voltage is applied to the barrier electrode so as to form a barrier electric field surrounding the optical axis of a charged particle beam and surrounding the article to be exposed.

11 Claims, 7 Drawing Sheets

CHARGED PARTICLE BEAM EXPOSURE APPARATUS

BACKGROUND OF THE INVENTION

The present invention generally relates to the production of semiconductor devices and more particularly to a charged particle beam exposure apparatus used in producing semiconductor devices.

Electron beam lithography is an essential technology in the production of advanced semiconductor integrated circuits having high integration. By using electron beam lithography, it is possible to expose the resist with a resolution of less than 0.05 $\mu$m and an alignment error of less than 0.02 $\mu$m. It is thought that electron beam lithography promises to play a central role in the future production of semiconductor devices such as a DRAM having a storage capacity exceeding 256 megabits or a high-speed microprocessor equipped with a significantly powerful operational capability.

A charged particle beam exposure apparatus generally comprises: a charged particle beam source for generating and emitting a charged particle beam, and for directing the beam along a predetermined optical axis to an article to be exposed; an electron lens which, provided around the optical axis, focuses the charged particle beam on the article; a deflector which deflects the charged particle beam with respect to the optical axis and which scans the surface of the article with the charged particle beam; a movable stage which, provided along the optical axis, movably holds the article. A desired semiconductor pattern is produced on the article by the charged particle.

FIG. 1 shows the schematic constitution of a conventional charged particle beam exposure apparatus or an electron beam exposure apparatus.

Referring to FIG. 1, an electron beam exposure apparatus includes a vacuum system 1 composed of a vacuum chamber 1a from which the air inside is evacuated through a valve 2a by means of a vacuum pump 2 and a vacuum column 1b extending above the vacuum chamber 1a. A movable stage 3 for supporting a semiconductor substrate 4 is provided in the vacuum chamber 1a. The movable stage 3 comprises a first stage plate 3a supported by a roller 3c so as to be movable in a X direction and a second stage plate 3b supported by a roller 3d so as to be movable in a Y direction with respect to the first stage plate. The vacuum chamber 1a is also provided with a driving mechanism (not shown) for moving the first and second stage plates 3a and 3b in the X and Y directions, respectively.

The vacuum column 1b is provided with an electron gun 5 for forming an electron beam along an optical axis O. The electron beam thus formed travels along the optical axis O to hit the substrate 4 so as to expose an electron beam resist formed on the substrate 4. An electron lens 6 for focusing the electron beam on the surface of the substrate 4 is provided around the optical axis O in the vacuum column 1b. An electron beam path 6a is formed around the optical axis O by the electron lens 6. A deflector 7 for deflecting the electron beam is formed in a part of the path 6a. By driving the deflector 7, the surface of the substrate 4 is scanned by the electron beam. By driving the deflector 7 and the movable stage 3 in a coordinated manner, it is possible to scan most of the surface of the substrate 4. A reflected electron detector 10 is provided in the lower end of the electron lens 6 opposite the substrate 4 so as to detect reflected electrons emitted by the substrate in response to the irradiation of the substrate 4 by the electron beam. The vacuum chamber 1a is also provided with a secondary electron detector 9 for detecting low-energy energy secondary electrons emitted by the substrate 4 in response to the irradiation thereof. These detectors are used in order to produce a substrate image characteristic of a scanning electron microscope.

A vacuum sub-chamber 1c is provided so as to communicate with the vacuum chamber 1a via a gate valve 1d. An entrance gate valve 1e is provided in the vacuum sub-chamber 1c so that the substrate 4 can be loaded into and removed from the vacuum chamber 1a. An arm mechanism 1f for introducing the substrate 4 into the vacuum sub-chamber 1c and transporting the same onto the stage 3 and a driving mechanism 1g for driving the arm mechanism 1f are also provided in the vacuum sub-chamber 1c.

Semiconductor device production yield is greatly reduced when dust collects on a substrate. Therefore, much effort has been put into eliminating dust as much as possible. The effect of dust is particularly serious in the case of semiconductor devices having a fine pattern produced by an electron beam exposure apparatus. As many as several thousands to several tens of thousands of dust particles are detected when a measurement is made of dust remaining on the substrate removed from the vacuum chamber after it has been introduced into the vacuum chamber in a clean state and then exposed. Accordingly, measures have been taken in the electron beam exposure apparatus as shown in FIG. 1 by which sliding portions such as rollers or bearings have been covered so as to prevent dust from being dispersed. Other measures taken are such that, when the substrate is removed from the vacuum system to an environment under atmospheric pressure, or when the substrate is introduced from the environment under atmospheric pressure into the vacuum chamber, suction of air into the vacuum system as well as evacuation therefrom is performed in a significantly slow manner so as to prevent dust from being dispersed. However, these measures are not effective enough to reduce by a satisfactory amount dust adhering to the substrate after it is exposed. For example, even if the sliding portions of the vacuum system are covered, it is inevitable that as many as several hundreds to several thousands of dust particles will remain on a 6-inch wafer.

The following facts were discovered by the inventors of the present invention while experimenting with the production of a semiconductor pattern on the substrate 4 by using the electron beam exposure apparatus as shown in FIG. 1.

1) A clean 6-inch substrate 4 was introduced into the vacuum sub-chamber 1c, which was then evacuated, and then air was sucked thereinto. When the substrate 4 was removed from the vacuum system to an environment under atmospheric pressure and the amount of dust was measured, it was found that there was little dust adhering to the substrate.

2) The substrate was introduced into the vacuum sub-chamber 1c, which was then evacuated. The arm 1f was then driven so as to move the substrate onto the stage 3, and then the substrate was moved back to the vacuum sub-chamber 1c unprocessed. A subsequent measurement revealed that there was little dust adhering to the substrate 4.

3) The process of driving the stage 3 so as to move the substrate 4 was added to the experimental process described in 2). It was found subsequently that there was still little dust adhering to the substrate 4.

4) The process of applying the electron beam on the substrate without moving the stage was added to the experimental process described in 2). It was found subsequently that there was still little dust adhering to the substrate 4.

5) The processes of 3) and 4) were carried out at the same time. A subsequent measurement revealed as many as several hundreds to several thousands of dust particles adhering to the substrate.

Since the process of 5) is indispensable when using the electron beam exposure apparatus, at least several hundred dust particles adheres to the substrate. Although the actual amount of dust depends on the exposure time, a reduction in the semiconductor device production yield is inevitable. The fact that a large amount of dust adheres to the substrate only when the process of 5) is carried out provides a useful hint as to how dust adheres to the surface of a substrate. That is, the dust adhering to the substrate after the exposure process is thought to be generated by the moving of the sliding parts of the vacuum system and charged in response to the application of the electron beam on the substrate. It is supposed that the entity which causes the dust to be charged is not the focused electron beam itself but reflected electrons, low-energy secondary electrons $e^-$ or positive ions generated by applying the electron beam on the substrate. These low-energy charged particles are generated in a large amount in the vacuum chamber $1a$. These particles fill the vacuum chamber $1a$ and negatively charge dust $d^-$ stirred up by the moving mechanism of the movable stage 3. The charged dust $d^-$ thus generated collects on the surface of the substrate 4 to cause a defect in the substrate.

SUMMARY OF THE INVENTION

Accordingly, a general object of the present invention is to provide a novel and useful charged particle beam exposure apparatus in which the above-mentioned problems are eliminated.

A more specific object of the present invention is to provide a charge particle beam apparatus in which dust is substantially prevented from adhering to the substrate on the stage even when the stage is moved while the electron beam is being applied on the substrate.

The above-mentioned objects of the present invention can be achieved by a charged particle beam exposure apparatus comprising:

charged particle beam source means for generating a charged particle beam and for directing the beam along a predetermined optical axis to an article to be exposed;

focusing means which, provided around the optical axis, focuses the charged particle beam on the article;

deflecting means for deflecting the charged particle beam with respect to the optical axis and for scanning the surface of the article with the charged particle beam;

supporting means which, provided on the optical axis, movably supports the article, wherein a desired pattern is produced on the article by the charged particle beam, the charged particle beam exposure apparatus further comprising:

a barrier electrode, having a passage through which the charged particle beam is passed, provided in correspondence with the optical axis, is provided in a space bordered by the surface of the article and by the focusing means so as to surround the optical axis and be separated from the surface of the article, wherein the barrier electrode produces, adjacent to the surface of the article, a barrier electric field which surrounds the article and captures low-energy charged particles.

According to the present invention, a barrier electric field formed by the barrier electrode prevents low-energy charged particles, generated when the charged particle beam is applied on the article to be exposed, from being scattered in the vacuum chamber. It thus becomes possible to minimize the degree by which the dust, generated by the moving of the sliding parts as the stage is moved in the vacuum chamber, is charged. The electric field formed by the barrier electrode is also effective in that, even when such charged dust is generated, it is prevented from invading the space adjacent to the surface of the substrate, and thus, adherence of dust to the surface of the substrate is effectively prevented. That is, by applying, for example, a positive voltage to the barrier electrode, low-energy charged particles or negatively charged dust can be effectively captured by the barrier electrode. As a result, the amount of dust arriving at the space adjacent to the surface of the substrate can be substantially reduced. It is also possible, by applying a negative voltage to the barrier electrode, to remove negatively charged dust from near the surface of the substrate by virtue of a repulsive force. Preferably, the barrier electrode is formed into a substantially large ring which surrounds the substrate.

BRIEF DESCRIPTION OF THE DRAWINGS

Other objects and further features of the present invention will be apparent from the following detailed description when read in conjunction with the accompanying drawings, in which.

DESCRIPTION OF THE PREFERRED EMBODIMENTS

A description will be given below, with reference to the attached drawings, of preferred embodiments of the present invention.

Figure 1:
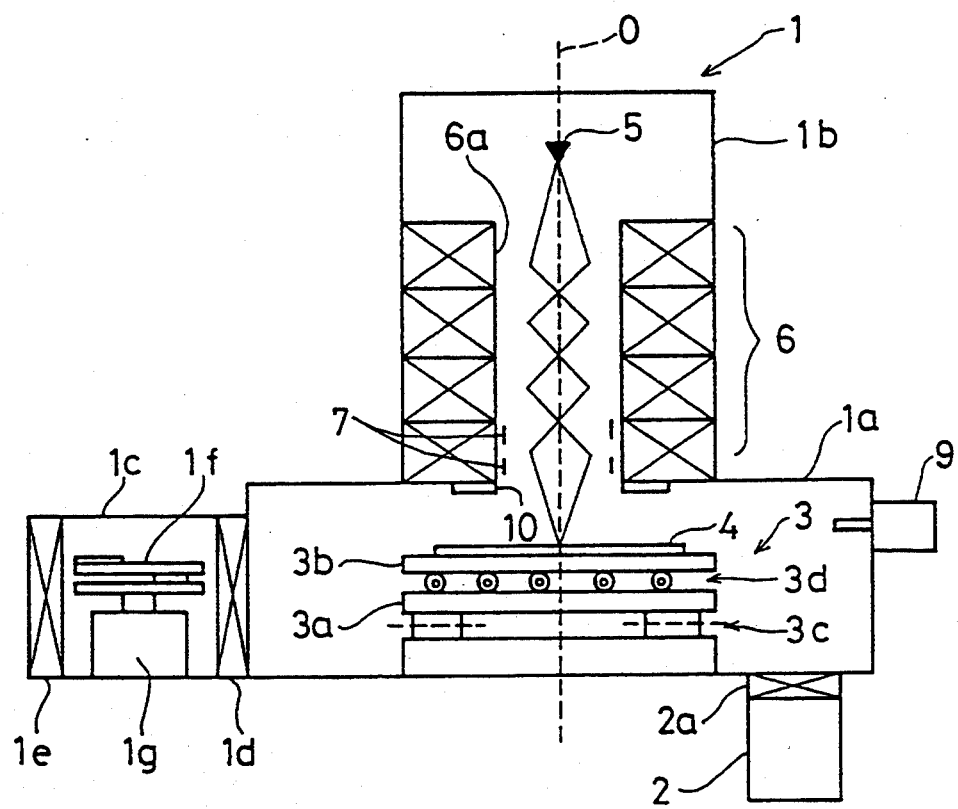
FIG. 1 shows the constitution of a conventional charged particle beam exposure apparatus.
Figure 2:
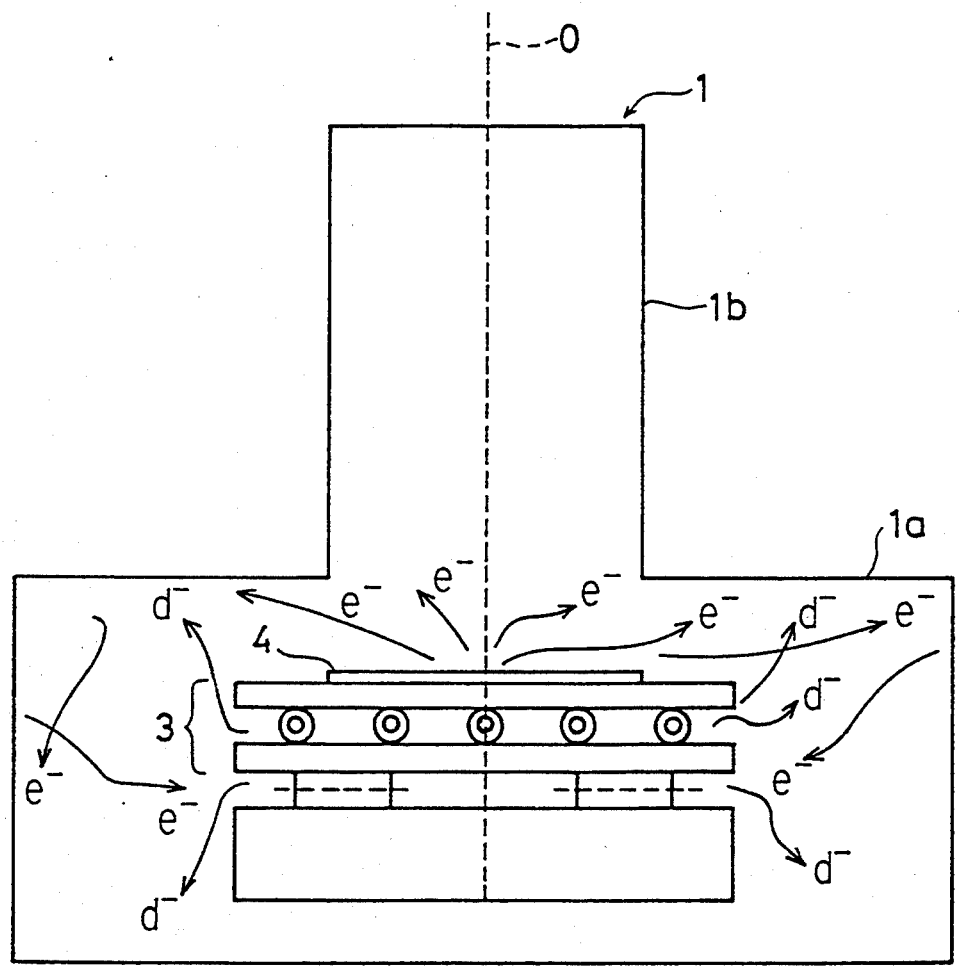
FIG. 2 shows how secondary electrons are emitted and dust is charged by such secondary electrons in the conventional charged particle beam exposure apparatus.
Figure 3:
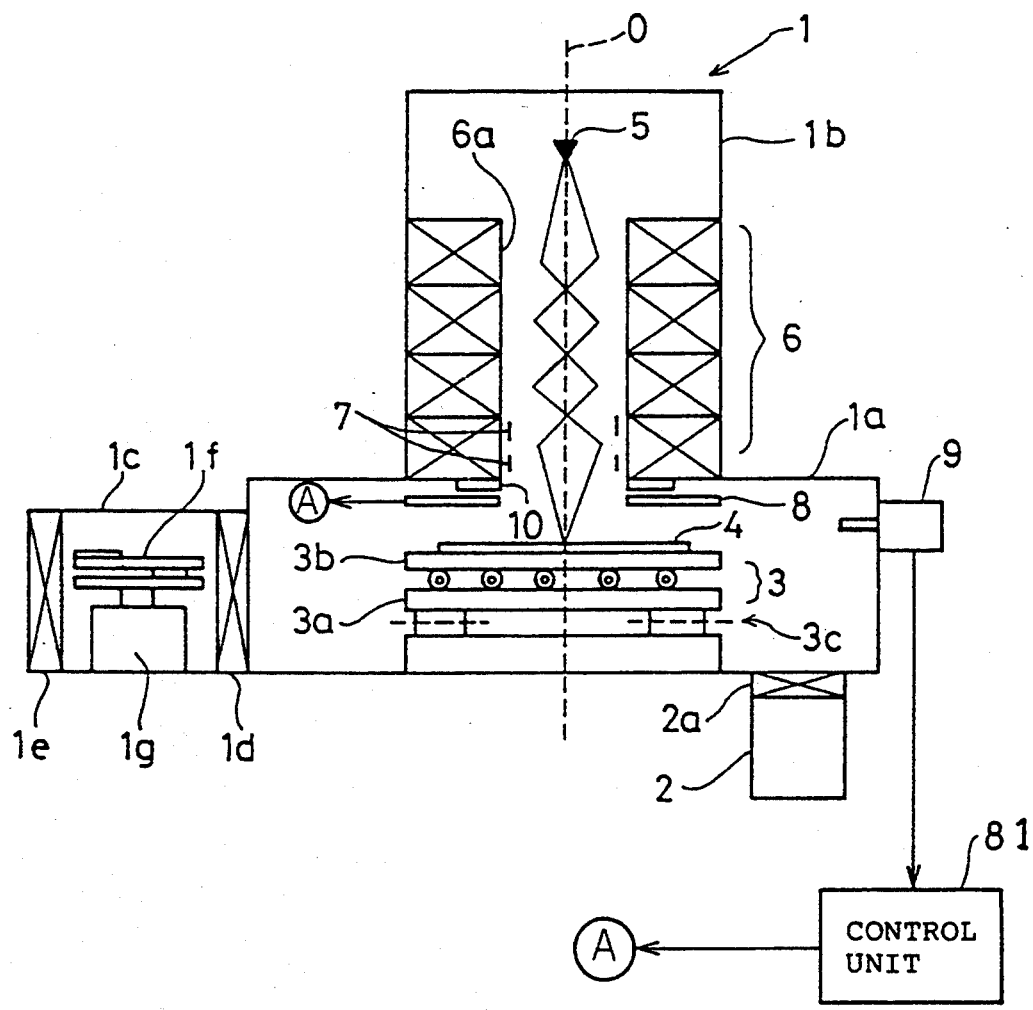
FIG. 3 shows the constitution of the charged particle beam exposure apparatus according to a first embodiment of the present invention.

FIG. 3 shows the schematic constitution of a charged particle beam exposure apparatus according to the present invention. In FIG. 3, those parts that correspond to the parts of FIG. 1 are denoted by the same reference numerals, and the description thereof is omitted.

Figure 4:
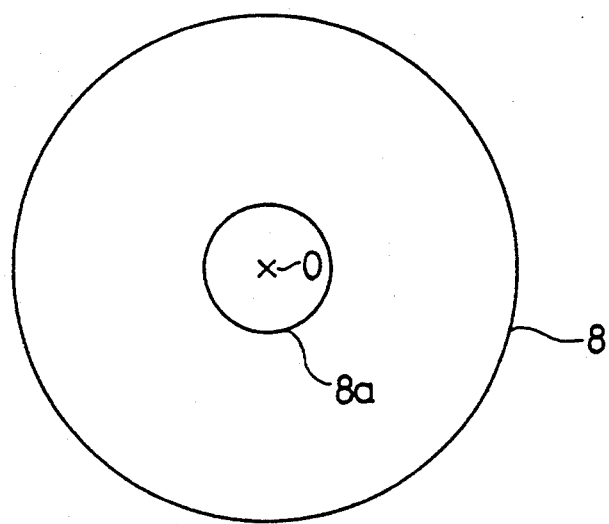
FIG. 4 shows the constitution of the barrier electrode used in the apparatus of FIG. 3.

Referring to FIG. 3, the charged electron beam exposure apparatus according to a first embodiment of the present invention includes a barrier electrode 8 formed around the optical axis O so as to be opposite the surface of the substrate 4. The barrier electrode 8 is located in a space bordered by the reflected electron detector 10 at the lower end of the electron lens 6 provided in the vacuum column 1b and by the substrate 4 held on the stage 3. As shown in FIG. 4, the barrier electrode 8 has the shape of a ring in which an opening 8a for allowing the electron beam to pass through is provided, the body of the electrode being conductive. The outside diameter of the barrier electrode 8 is set to be larger than the outside diameter of the substrate 4. The outer edge of the barrier electrode 8 is electrically connected to a control unit 81. The control unit 81 applies a predetermined voltage to the barrier electrode 8 so as to create an electric field which prevents charged dust stirred up or formed by the movement of the stage 3 in response to the application of an electron beam on the substrate from invading the space adjacent to the surface of the substrate 4. In the example shown in the figure, the control unit 81 is supplied with an output signal of the secondary electron detector 9, and the predetermined voltage is set at a level at which no secondary electrons are detected by the secondary electron detector 9.

Figure 5:
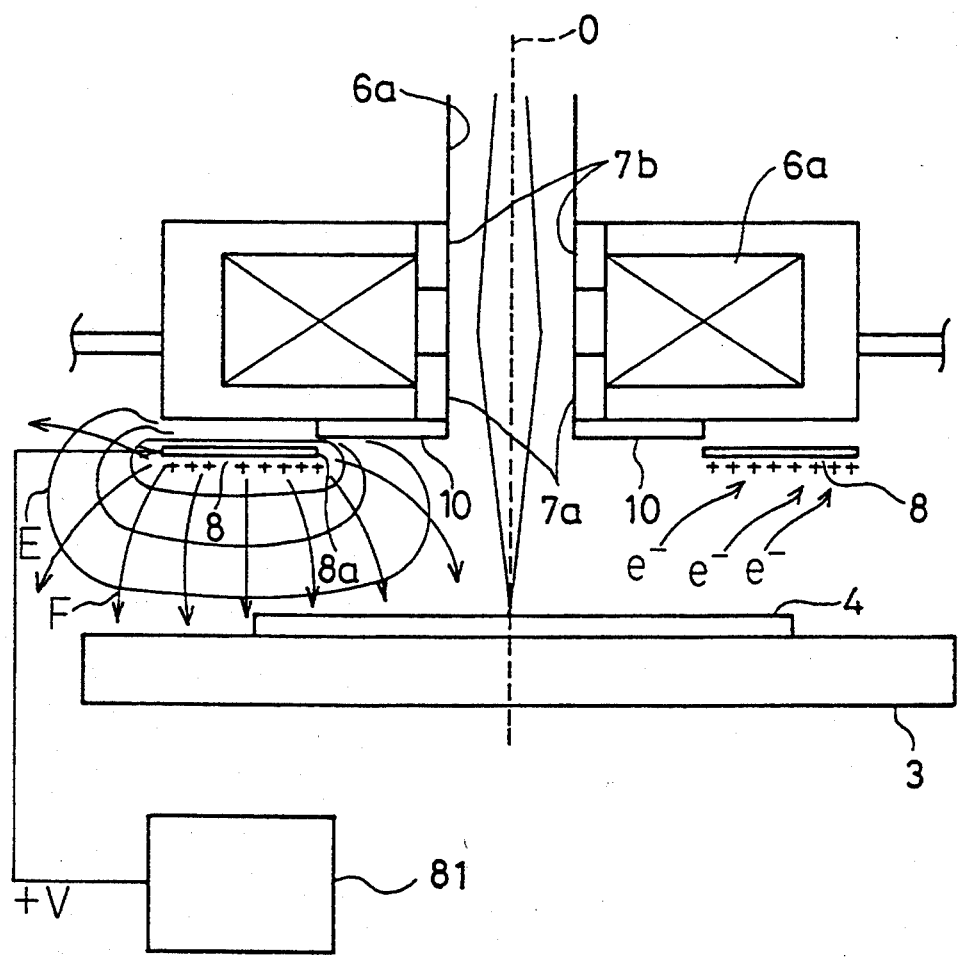
FIG. 5 shows the function of the barrier electrode used in the apparatus of FIG. 3.

FIG. 5 shows the function of the barrier electrode 8 shown in FIG. 3.

Referring to FIG. 5, a positive voltage +V is applied to the barrier electrode 8 by means of the control unit 81 so as to produce an electric field E. In the figure, the electric flux lines associated with the electric field E are indicated by the symbol F. Upon formation of the electric field E, low-energy secondary electrons e− formed as a result of irradiation of the substrate 4 by the electron beam are captured by the electrode 8 to be eliminated from the space adjacent to the substrate 4. At the same time, negatively charged dust is captured by the electrode 8, thus preventing the surface of the substrate from being contaminated. As has been described with reference to FIG. 3, it is preferable that the voltage +V be set at a level which ensures that the secondary electron detector 9 does not substantially detect secondary electrons.

In the electron beam exposure apparatus as shown in FIG. 5 having the ring-shaped electrode 8 near the surface of the substrate 4, adjustment of the optical axis O of the electron beam is conducted while applying the predetermined voltage +V to the electrode 8. This is to minimize the effect of the electric field E on the optical axis O.

Figure 6A:
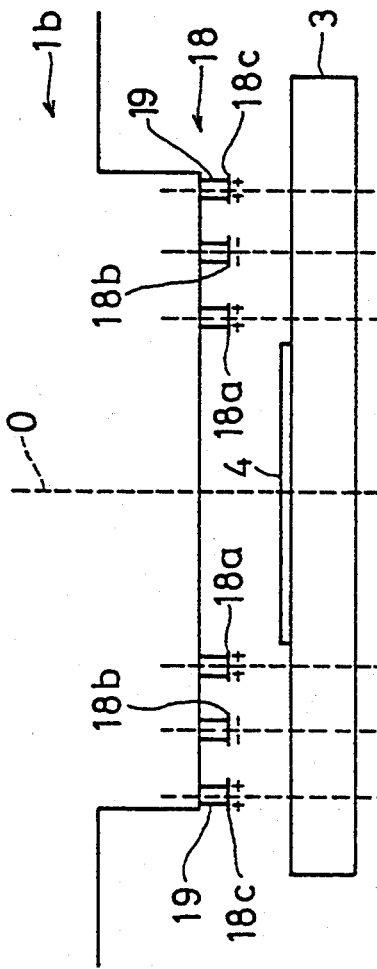
FIG. 6A shows the constitution of a second embodiment.
Figure 6B:
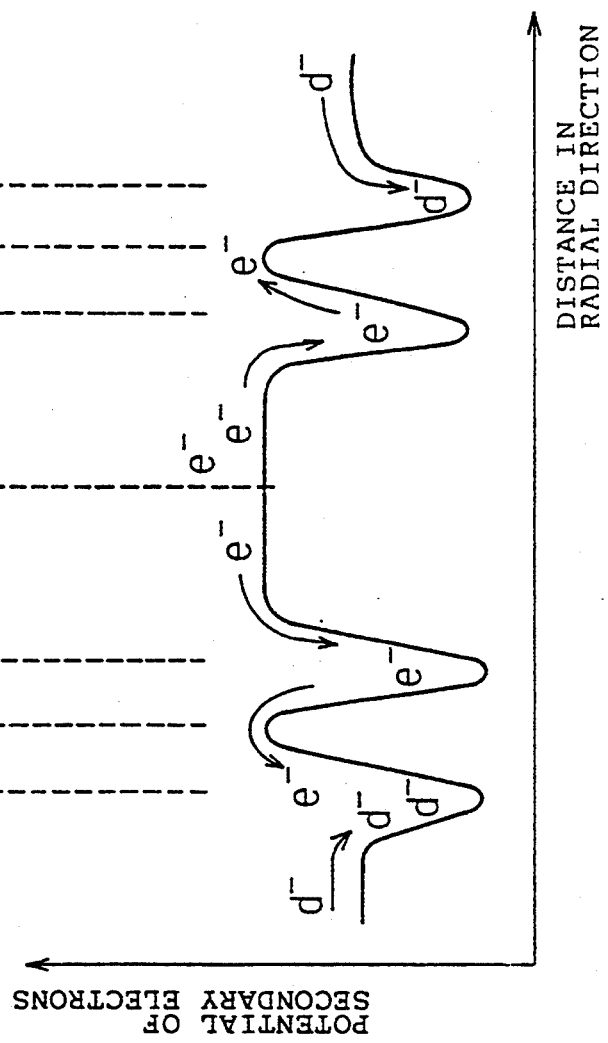
FIG. 6B shows the function of the second embodiment.

A description will now be given, with reference to FIGS. 6A and 6B, of the electron beam exposure apparatus according to a second embodiment of the present invention. In FIGS. 6A and 6B, those parts that are identical to the parts already described in the first embodiment are denoted by the same reference notations, and the descriptions thereof are omitted.

Referring to FIG. 6A, three separate concentrically arranged ring-shaped electrodes 18a, 18b and 18c constituting a barrier electrode 18, instead of the single ring-shaped electrode 8 shown in FIGS. 3 and 4, are used in the second embodiment. Each of the electrodes 18a–18c is supported on insulating pillars 19 so as to surround the substrate 4 subject to exposure, a control voltage being independently applied to each electrode by means of the control unit 81. In this embodiment, a positive voltage +V is applied to the outer most electrode 18c and the inner most electrode 18a, and a negative voltage −V is applied to the intermediate electrode 18b.

When a control voltage is applied to the electrodes 18a–18c as mentioned above, the electric potential on and near the surface of the substrate 4 is as indicated in FIG. 6B, the spatial variation thereof being in correspondence with the arrangement of the electrodes 18a–18c. In this embodiment, since the positive voltage is applied to the outer most electrode 18c and the inner most electrode 18a, two low-potential areas and a high-potential area intervening between the low-potential areas are produced, each of these areas surrounding the substrate 4. As a result of this, secondary electrons emitted by the substrate 4 in response to the irradiation of the substrate 4 are captured by the low-potential area corresponding to the electrode 18a and are prevented from escaping due to the high-potential area corresponding to the intermediate electrode 18b. Consequently, the secondary electrons are prevented from being dissipated in the vacuum chamber 1a, and the dust stirred up by the movement of the stage 3 is prevented from being charged. As a result, the contamination of the substrate due to the dust is prevented. It is further to be noted that the invasion, into the space adjacent to the substrate 4, of the dust which is formed in the vacuum chamber 1a and negatively charged by the secondary electrons, is prevented such that the charged dust is either captured by the low-potential area corresponding to the electrode 18c or prevented by the high-potential area corresponding to the electrode 18b from arriving at the space adjacent to the substrate 4.

The magnitude of the positive or negative control voltage V applied to the electrodes 18a–18c is set such that secondary electron detector 9 shown in FIG. 3 does not detect secondary electrons. In this way, the dissipation of secondary electrons in the vacuum chamber 1a is effectively prevented.

Figure 7:
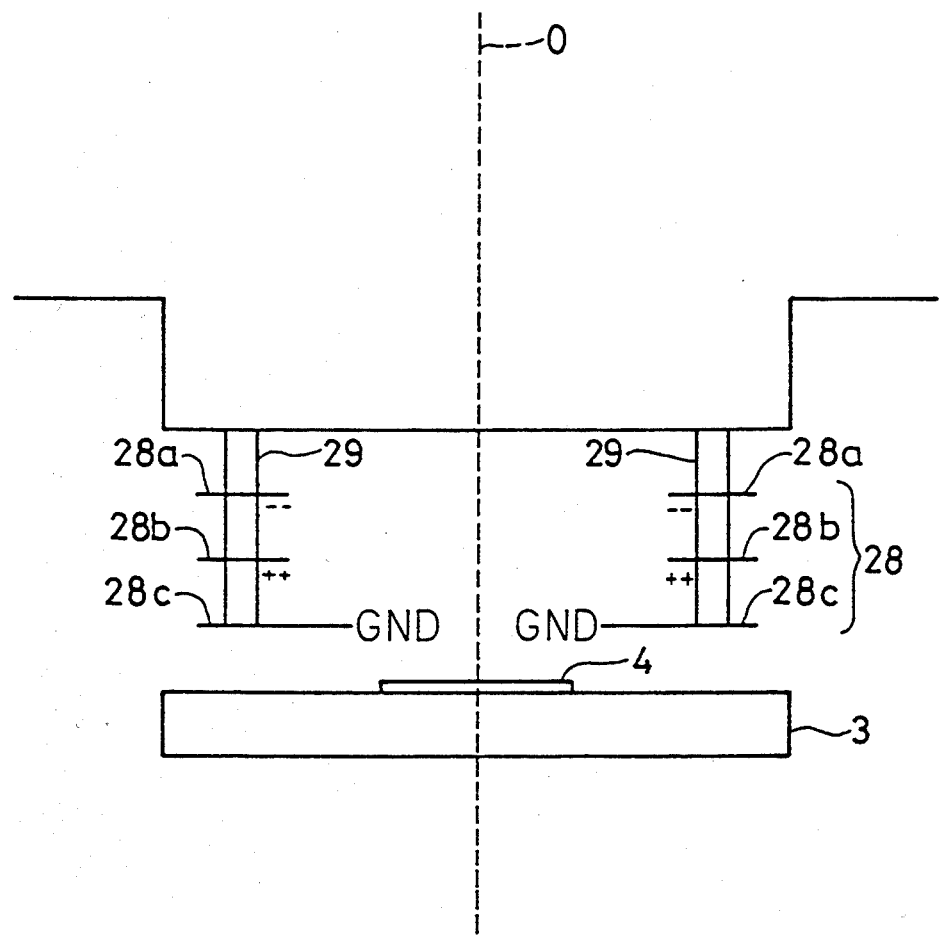
FIG. 7 shows the constitution of a third embodiment.

FIG. 7 shows the constitution of a charged particle beam exposure apparatus according to a third embodiment of the present invention. In FIG. 7, those parts that have already been described in the previous embodiments are identified by the same reference numerals, and the descriptions thereof are omitted.

Referring to FIG. 7, this embodiment includes ring-shaped electrodes 28a, 28b and 28c coaxially arranged around the optical axis O, instead of the barrier electrode 8 or 18 described earlier, the electrodes 28a–28c being supported by an insulating pillar 29 so as to form a barrier electrode 28. It will be noted that a negative voltage is applied to the uppermost electrode 28a so as to form a barrier electric field, and a positive voltage is applied to the intermediate electrode 28b so as to capture negatively charge dust and secondary electrons. The lowermost electrode 28c nearest the substrate 4 is grounded so as to be at the same electric potential as the substrate 4, with the result that discharge between the substrate 4 and the barrier electrode 28 is avoided. Further, the barrier electrode 28 constitution of this embodiment ensures that a strong electric field can be generated with a low potential, and that disturbance of the electric field on account of the movement of the stage is minimized.

As has been described above, the present invention makes it possible, by means of the barrier electrode, to capture low-energy charged particles such as secondary electrons emitted from the substrate in response to the irradiation of the substrate by the electron beam so that these particles are not dissipated in the vacuum chamber. As mentioned above, it is assumed that such particles cause the dust to be charged. Thus, the charging of the dust, which conventionally takes place when the stage is moved while the electron beam is being applied on the substrate, is effectively prohibited in the present invention. Even when the dust is charged, it is captured by the barrier electrode and thus prevented from collecting on the surface of the substrate, thereby improving the substrate production yield of the electron beam exposure apparatus.

The present invention is not limited to the above described embodiments, and variations and modifications may be made without departing from the scope of the present invention.

What is claimed is:

1. A charged particle beam exposure apparatus comprising:
    charged particle beam source means for generating a charged particle beam and for directing the beam along a predetermined optical axis to an article to be exposed;
    focusing means which, provided around said optical axis, focuses said charged particle beam on said article;
    deflecting means for deflecting said charged particle beam with respect to said optical axis and for scanning the surface of said article with said charged particle beam;
    supporting means which, provided on said optical axis, movably supports said article,
    wherein a desired pattern is produced on said article by said charged particle beam,
    said charged particle beam exposure apparatus further comprising:
    a barrier electrode, having a passage, in correspondence with said optical axis, through which said charged particle beam is passed, said barrier electrode being provided in a space bordered by the surface of said article and by said focusing means so as to surround said optical axis and be separated from the surface of said article,
    wherein said barrier electrode produces, adjacent to the surface of said article, a barrier electric field which surrounds said article and captures low-energy charged particles without generating signals indicating such capture.

2. The charged particle beam exposure apparatus as claimed in claim 1, further comprising voltage applying means for applying a voltage to said barrier electrode,
    wherein said voltage applying means sets said voltage at a level at which a secondary electron detecting means does not detect said low-energy charged particles.

3. The charged particle beam exposure apparatus as claimed in claim 1,
    wherein said barrier electrode comprises a ring-shaped conductive member, having a passage through which said charged particle beam is passed, provided in correspondence with said optical axis.

4. The charged particle beam exposure apparatus as claimed in claim 1,
    wherein said barrier electrode comprises a plurality of ring-shaped conductive members having different sizes, a passage through which said charged particle beam is passed being provided in each of said members in correspondence with said optical axis, and
    said plurality of ring-shaped conductive members are arranged substantially concentrically with respect to said optical axis.

5. The charged particle beam exposure apparatus as claimed in claim 4, wherein a voltage is independently applied to each of said plurality of ring-shaped conductive members.

6. The charged particle beam exposure apparatus as claimed in claim 4, wherein alternate positive and negative voltages are applied to said plurality of ring-shaped conductive members arranged concentrically in a radial direction.

7. The charged particle beam exposure apparatus as claimed in claim 1, wherein said barrier electrode comprises a plurality of coaxially arranged ring-shaped conductive members of substantially the same diameter, each of said members having a passage through which said charged particle beam is passed provided in correspondence with said optical axis.

8. The charged particle beam exposure apparatus as claimed in claim 7, wherein, of said plurality of ring-shaped conductive members, the conductive member nearest the surface of said article is maintained at the same electrical potential as said article.

9. A method for exposing a pattern on an object by a charged particle beam, comprising the steps of:
    producing a charged particle beams such that said charged particle beam travels toward said object along a predetermined optical path;
    focusing said charged particle beam upon said object to expose a pattern on said object; and
    forming a potential field around said object by activating an electrode such that charged particles emitted from said object in response to irradiation by said charged particle beam, are collected by said potential field to said electrode and are not detected.

10. A method as claimed in claim 9, wherein said step of forming the potential field is conducted such that said potential field surrounds said predetermined optical axis in a manner generally symmetrical about said optical axis.

11. A method as claimed in claim 10, wherein said step of forming the potential field is conducted such that said potential field includes a pair of minima separated by a maximum, each of said minima and maximum surrounding said predetermined optical axis symmetrically.

* * * * *